United States Patent
Okushima (10) Patent No.: US 9,076,654 B2
(45) Date of Patent: *Jul. 7, 2015

(54) SEMICONDUCTOR DEVICE

(75) Inventor: Mototsugu Okushima, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/552,345

(22) Filed: Jul. 18, 2012

(65) Prior Publication Data

US 2012/0281324 A1    Nov. 8, 2012

Related U.S. Application Data

(62) Division of application No. 12/824,719, filed on Jun. 28, 2010, now Pat. No. 8,248,742.

(30) Foreign Application Priority Data

Jul. 23, 2009    (JP) .................. 2009-172562

(51) Int. Cl.
 H02H 9/04    (2006.01)
 H01L 27/02    (2006.01)

(52) U.S. Cl.
 CPC .................. H01L 27/0262 (2013.01)

(58) Field of Classification Search
 CPC ............ H01L 27/0266; H01L 27/0251; H01L 27/0255; H01L 27/0262; H02H 9/046
 USPC .................................. 361/56, 111
 See application file for complete search history.

(56) References Cited

U.S. PATENT DOCUMENTS

| | | | |
|---|---|---|---|
| 5,400,202 A * | 3/1995 | Metz et al. ................ | 361/56 |
| 5,917,689 A * | 6/1999 | English et al. ............. | 361/56 |
| 6,618,233 B1 * | 9/2003 | Russ et al. ................ | 361/111 |
| 7,112,852 B2 | 9/2006 | Okushima | |
| 7,405,915 B2 * | 7/2008 | Choi .......................... | 361/56 |
| 7,821,752 B2 * | 10/2010 | Choi .......................... | 361/56 |
| 8,248,742 B2 * | 8/2012 | Okushima .................. | 361/56 |
| 2007/0236842 A1 | 10/2007 | Kuo | |
| 2008/0217650 A1 | 9/2008 | Morishita | |
| 2011/0079818 A1 | 4/2011 | Morishita | |

FOREIGN PATENT DOCUMENTS

JP    2003-526200 A    9/2003
JP    2008-218886 A    9/2008

OTHER PUBLICATIONS

Amitava Chatterjee et al., A Low-Voltage Triggering SCR for On-Chip ESD Protection at Output and Input Pads, IEEE Electron Device Letters, vol. 12, No. 1, Jan. 1991, 2 pages.
C. Russ et al., GGSCRs: GGNMOS Triggered Silicon Controlled Rectifiers for ESD Protection in Deep Sub-Micron CMOS Processes, EOS/ESD Symposium, 2001, pp. 01-22-01-31.
Yasuyuki Morishita et al., A Low-Leakage SCR Design Using Trigger-PMOS Modulations for ESD Protection, EOS/ESD Symposium, 2007, pp. 07-376-07-384.

* cited by examiner

*Primary Examiner* — Jared Fureman
*Assistant Examiner* — Nicholas Ieva
(74) *Attorney, Agent, or Firm* — Foley & Lardner LLP (57) ABSTRACT

A semiconductor device has: a power supply line; a ground line; a signal line for transmitting a signal; a signal pad connected to the signal line; a protection element connected between the signal line and the ground line; and a trigger circuit configured to supply a trigger current to the protection element. The trigger circuit has: a PMOS transistor whose gate and backgate are connected to the power supply line and whose source is connected to the protection element; and an amplifier circuit part configured to amplify a first current flowing through the PMOS transistor to generate a second current. The trigger current includes the second current.

3 Claims, 8 Drawing Sheets

SEMICONDUCTOR DEVICE

INCORPORATION BY REFERENCE

This application is a divisional of U.S. application Ser. No. 12/824,719, filed Jun. 28, 2010, which claims benefit of priority from the prior Japanese Application No. 2009-172562, filed on Jul. 23, 2009; the entire contents of all of which are incorporated herein by reference.

BACKGROUND OF THE INVENTION

1. Field of the Invention

The present invention relates to a semiconductor device, and particularly to an electrostatic discharge protection circuit in a semiconductor device.

2. Description of Related Art

A semiconductor device is provided with an electrostatic discharge protection circuit in order to protect an internal circuit against ESD (electrostatic discharge) surge which is applied to an input/output pad. One well-known circuit topology of the electrostatic discharge protection circuit is that uses an active element such as a thyristor and a bipolar transistor. The electrostatic discharge protection circuit using the active element has an advantage in that discharge capacity is high because it performs an active operation when surge is inputted, and thus the circuit is widely used (see for example: "A Low-Voltage Triggering SCR for On-Chip ESD Protection at Output and Input Pads", IEEE Electron Device Letters, vol. 12, No. 1, January 1991 (non-patent document 1) and "GGSCRs: GGNMOS Triggered Silicon Controlled Rectifiers for ESD Protection in Deep Sub-Micron CMOS Processes", EOS/ESD Symposium 2001, p. 22 (non-patent document 2)).

It is desired for the electrostatic discharge protection circuit using the active element that a leakage current at a time of a normal operation is small and a trigger voltage when the ESD surge is applied is low. A configuration of the electrostatic discharge protection circuit to satisfy such requirements is disclosed in "A Low-Leakage SCR Design Using Trigger-PMOS Modulations for ESD Protection", EOS/ESD Symposium 07-376 (non-patent document 3) and Japanese Patent Publication JP-2008-218886A.

Figure 1:
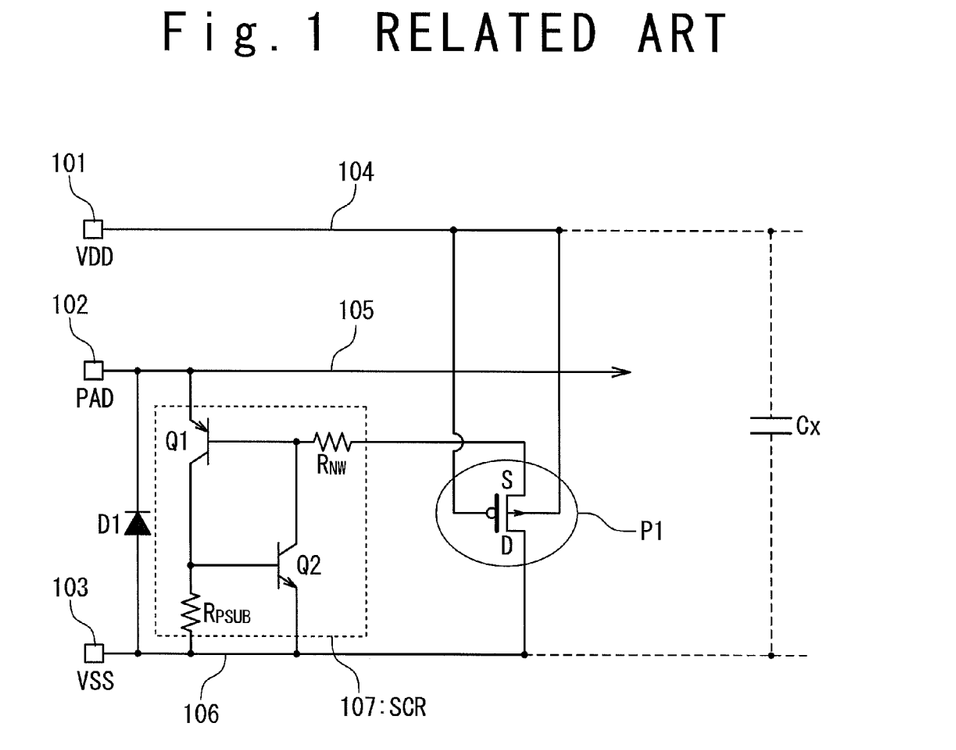
FIG. 1 is a circuit diagram showing a configuration of an electrostatic discharge protection circuit according to a related technique.

FIG. 1 is a circuit diagram showing the configuration of the electrostatic discharge protection circuit disclosed in the non-patent document 3 (note that an electrostatic discharge protection circuit having the same configuration is disclosed also in Japanese Patent Publication JP-2008-218886A). The electrostatic discharge protection circuit shown in FIG. 1 has a VDD pad 101, a signal pad 102, a VSS pad 103, a power supply line 104, a signal line 105, a ground line 106, a thyristor 107, an ESD protection diode D1 and a PMOS transistor P1.

In the electrostatic discharge protection circuit shown in FIG. 1, the PMOS transistor P1 functions as a trigger element for supplying a trigger current to the thyristor 107. The electrostatic discharge protection circuit shown in FIG. 1 can treat various modes of ESD surges applied to the VDD pad 101, the signal pad 102 and the VSS pad 103. However, the description hereinafter is made only for an operation in a case where an ESD surge such that a potential of the signal pad 102 is positive as compared with a potential of the VSS pad 103 is applied between the signal pad 102 and the VSS pad 103, which is a subject of the present invention.

In the case where the ESD surge such that the potential of the signal pad 102 is positive as compared with the potential of the VSS pad 103 is applied between the signal pad 102 and the VSS pad 103, the power supply line 104 becomes a floating state. Since a power supply capacitor Cx is parasitically or intentionally provided between the power supply line 104 and the ground line 106, the power supply line 104 is fixed at substantially the same potential as that of the ground line 106 until the power supply capacitor Cx is charged. When the positive ESD surge is applied to the signal pad 102 and a potential of the signal line 105 at the same potential is increased, a source potential of the PMOS transistor P1 becomes higher than a gate potential thereof (being the same potential as that of the power supply line 104 and substantially the same potential as that of the ground line 106) and a gate-source voltage of the PMOS transistor P1 exceeds a threshold voltage. When the gate-source voltage of the PMOS transistor P1 exceeds the threshold voltage, the PMOS transistor P1 operates to supply the trigger current to the thyristor 107, and thereby the thyristor 107 operates to discharge the ESD surge.

The inventor of the present application has recognized the following points. One problem in the configuration of the electrostatic discharge protection circuit shown in FIG. 1 is that the PMOS transistor P1 may become hard to perform a low-voltage operation, depending on a configuration of the internal circuit to be protected and other associated circuits/associated elements. For example, let us consider a case shown in FIG. 2A where an output circuit is used as an internal circuit connected to the signal line 105 and a PMOS transistor P11 is used as a pull-up transistor of the output circuit. In this case, when the ESD surge such that the potential of the signal pad 102 is positive is applied, a parasitic diode D11 formed between the signal line 105 and the power supply line 104 by a P-type diffusion layer of a drain and an N-well of a backgate of the PMOS transistor P11 is forward biased (see FIG. 2B). Accordingly, a charging path passing through the parasitic diode D11 is formed and thus the power supply line 104 is charged rapidly. When the power supply line 104 is charged, the potential of the power supply line 104 increases following the potential of the signal line 105 and thus the gate-source voltage of the PMOS transistor P1 hardly increases. As a result, in the circuit configuration shown in FIG. 2A, a voltage between the signal line 105 and the power supply line 104 becomes as small as a voltage of the forward bias voltage Vf_D11 of the parasitic diode D11, namely about 0.6 V to 1.1 V.

However, in order for the PMOS transistor P1 to operate, the source-gate voltage Vgs of the PMOS transistor P1 needs to exceed the threshold voltage Vt_P1. By using a base-emitter voltage Vbe of a PNP transistor Q1 in the thyristor 107, the source-gate voltage Vgs of the PMOS transistor P1 can be expressed by the following equation (1).

$$Vgs = Vf\_D11 - Vbe \qquad \text{Equation (1):}$$

Therefore, in order to operate the PMOS transistor P1, a condition expressed by the following equation (2) needs to be satisfied.

$$Vf\_D11 - Vbe > Vt\_P1 \qquad \text{Equation (2):}$$

Here, "Vf_D11" and "Vbe" each is a forward bias voltage of a PN junction, which is approximately 0.6 V. That is, the condition expressed by the equation (2) is not satisfied depending on an operation condition, which results in a problem that the thyristor 107 fails to perform the discharging operation. Even if a large current flows through the parasitic diode D11 and the condition expressed by the equation (2) is satisfied, a difference between the source-gate voltage Vgs of the PMOS transistor P1 and its threshold voltage Vt_P1 becomes small, and thus a current flowing through the PMOS transistor P1, namely the trigger current may become small. If the trigger current supplied to the thyristor 107 becomes small, the thyristor 107 may be broken without operating or the internal circuit may be broken due to application of voltage stress.

Figure 3:
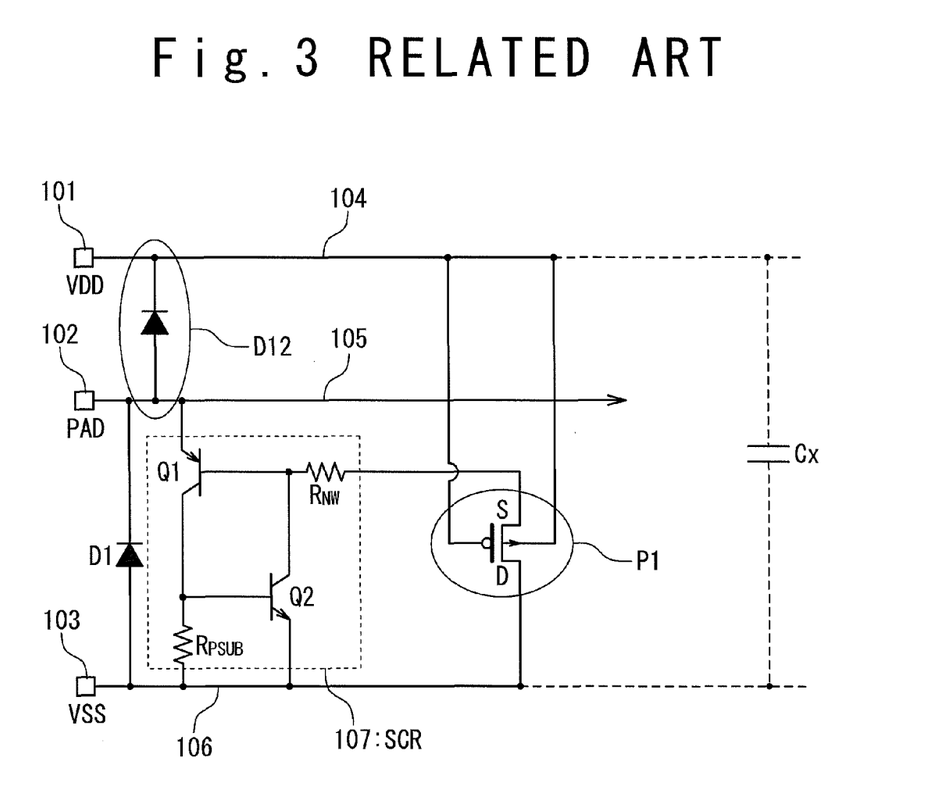
FIG. 3 is a circuit diagram for explaining a problem in the electrostatic discharge protection circuit shown in FIG. 1.

The same applies to a case shown in FIG. 3 where an electrostatic discharge protection diode D12 is provided between the signal line 105 and the power supply line 104. Also in this case, when the ESD surge such that the potential of the signal pad 102 is positive is applied, the electrostatic discharge protection diode D12 is forward biased. Accordingly, a charging path passing through the electrostatic discharge protection diode D12 is formed and thus the power supply line 104 is charged rapidly. When the power supply line 104 is charged, the potential of the power supply line 104 increases following the potential of the signal line 105 and thus the gate-source voltage of the PMOS transistor P1 hardly increases. This is not preferable because the PMOS transistor P1 may not operate or the trigger current may be reduced.

SUMMARY

In one embodiment of the present invention, a semiconductor device has: a power supply line; a ground line; a signal line for transmitting a signal; a signal pad connected to the signal line; a protection element connected between the signal line and the ground line; and a trigger circuit configured to supply a trigger current to the protection element. The trigger circuit has: a PMOS transistor whose gate and backgate are connected to the power supply line and whose source is connected to the protection element; and an amplifier circuit part configured to amplify a first current flowing through the PMOS transistor to generate a second current. The trigger current includes the second current.

According to the present invention, an electrostatic discharge protection circuit is provided which can operate at a low voltage even when a part of discharging current flows from the signal line to the power supply line.

BRIEF DESCRIPTION OF THE DRAWINGS

The above and other objects, advantages and features of the present invention will be more apparent from the following description of certain preferred embodiments taken in conjunction with the accompanying drawings, in which.

DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

Figure 4:
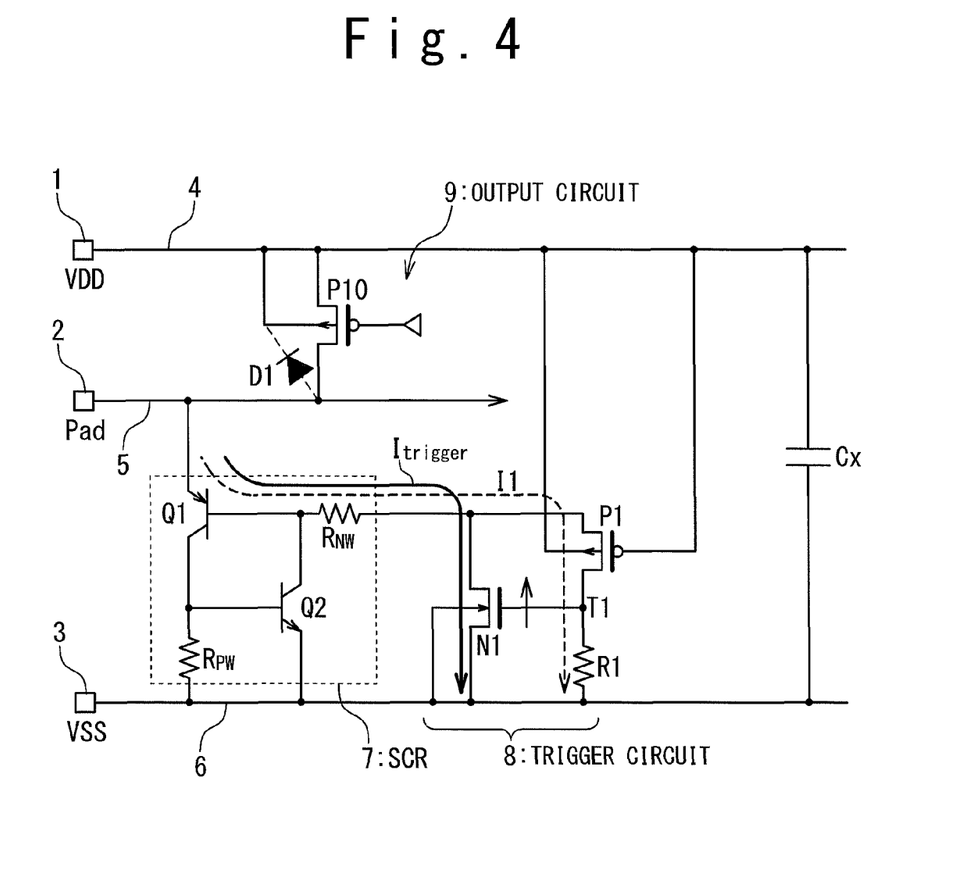
FIG. 4 is a circuit diagram showing a configuration of a semiconductor device according to a first embodiment of the present invention.

FIG. 4 is a circuit diagram showing a configuration of a semiconductor device according to a first embodiment of the present invention. In particular, FIG. 4 shows a configuration of an electrostatic discharge protection circuit integrated on the semiconductor device. In the present embodiment, the semiconductor device has a VDD pad 1, a signal pad 2, a VSS pad 3, a power supply line 4, a signal line 5, a ground line 6, a thyristor 7 and a trigger circuit 8. The VDD pad 1 and the VSS pad 3 are respectively connected to the power supply line 4 and the ground line 6, and the signal pad 2 is connected to the signal line 5. The signal line 5 is for transmitting a signal, and the signal pad 2 is an external connection pad for inputting and/or outputting the signal. An internal circuit is connected to the signal line 5. In FIG. 4, a PMOS transistor P10 of an output circuit 9 as the internal circuit is shown. The PMOS transistor P10 is a pull-up transistor for pulling up the signal line 5 in response to a signal supplied to its gate. A drain of the PMOS transistor P10 is connected to the signal line 5, and a source and a backgate thereof are connected to the power supply line 4.

In the present embodiment, the electrostatic discharge protection circuit is so configured as to include the thyristor 7 and the trigger circuit 8. The thyristor 7 functions as a protection element that discharges electric charges when a positive polarity ESD surge is applied to the signal pad 2. The thyristor 7 has an anode connected to the signal line 5 and a cathode connected to the ground line 6. In FIG. 4, the thyristor 7 is represented equivalently so as to include a PNP transistor Q1, an NPN transistor Q2, a P-well resistor $R_{PW}$ and an N-well resistor $R_{NW}$.

The trigger circuit 8 is a circuit that generates a trigger current for turning ON the thyristor 7. In the present embodiment, the trigger circuit 8 has a PMOS transistor P1, an NMOS transistor N1 and a resistor element R1. A source of the PMOS transistor P1 is connected to a gate of the thyristor 7, a drain thereof is connected to a node T1, and a gate and a backgate thereof are connected to the power supply line 4. A drain of the NMOS transistor N1 is connected to the gate of the thyristor 7, a source and a backgate thereof are connected to the ground line 6, and a gate thereof is connected to the node T1. The resistor element R1 is connected between the node T1 and the ground line 6.

An operation of the semiconductor device of the present embodiment will be described hereinafter. In the case where the PMOS transistor P10 is connected between the power supply line 4 and the signal line 5 as described above, when ESD surge is applied to the signal pad 2, the potential of the power supply line 4 is increased along with the potential of the signal line 5 due to existence of a parasitic diode D1. Even in this case, the semiconductor device according to the present embodiment can properly perform the operation of discharging the ESD surge.

More specifically, in the present embodiment, the trigger circuit 8 is configured such that an amplified current of a current I1 flowing through the PMOS transistor P1 flows through the NMOS transistor N1, and the amplified current flowing through the NMOS transistor N1 is used as the trigger current $I_{trigger}$. Therefore, even if the current I1 is small due to a small source-gate voltage of the PMOS transistor P1, it is possible to generate a large trigger current $I_{trigger}$ to operate the thyristor 7. More specifically, in the present embodiment, the trigger circuit 8 has an amplifier circuit part that includes the NMOS transistor N1 and the resistor element R1. The amplifier circuit part amplifies the current I1 (first current) flowing through the PMOS transistor P1 to generate the above-mentioned amplified current (second current) flowing through the NMOS transistor N1. The amplification of the current I1 flowing through the PMOS transistor P1 is achieved by flowing the current I1 through the resistor element R1 connected between the gate and source of the NMOS transistor N1. By adequately adjusting a resistance value of the resistor element R1, the source-gate voltage of the NMOS transistor N1 at the time when the current I1 flows can be made sufficiently large.

It should be noted here that in the present embodiment, the PMOS transistor P1 and the NMOS transistor N1 do not perform a parasitic bipolar operation. That is, the PMOS transistor P1 and the NMOS transistor N1 generate the trigger current $I_{trigger}$ by normal MOS operation and no parasitic bipolar operation contributes to the generation of the trigger current $I_{trigger}$. This is effective for achieving a low voltage operation.

An operation example of the semiconductor device of the present embodiment will be described in detail hereinafter.

When the ESD surge is applied to the signal pad 2, the potential of the signal line 5 becomes higher than the potential of the power supply line 4 and the source potential of the PMOS transistor P1 becomes higher than the gate potential thereof. Accordingly, the PMOS transistor P1 starts to operate and the current I1 flows through the PMOS transistor P1. However, since the power supply capacitor Cx is rapidly charged through the parasitic diode D1 of the PMOS transistor P10, the current I1 of the PMOS transistor P1 does not become so large. The current I1 is insufficient for the trigger current for the thyristor 7.

Meanwhile, since the current I1 generated in the PMOS transistor P1 flows through the resistor element R1, the potential of the node T1, namely the source-gate voltage of the NMOS transistor N1 is increased. Here, the source-gate voltage $Vgs\_N1$ of the NMOS transistor N1 is expressed by the following equation (3).

$$Vgs\_N1 = I1 \times R1 \quad \text{Equation (3):}$$

When the current I1 flows and the potential of the node T1 becomes higher than a threshold voltage of the NMOS transistor N1, the NMOS transistor N1 starts to operate and the trigger current $I_{trigger}$ flows. Since the potential of the node T1 is expressed by I1×R1, the potential of the node T1 when the current I1 flows can be made higher than the threshold voltage of the NMOS transistor N1 by appropriately setting the resistance value of the resistor element R1. Also, the amount of the trigger current $I_{trigger}$ can be adjusted by adjusting the resistance value of the resistor element R1. For example, when the current I1 generated in the PMOS transistor P1 is 1 mA, the source-gate voltage $Vgs\_N1$ of the NMOS transistor N1 becomes 1 V (=1 mA×1 kΩ) by setting the resistance value of the resistor element R1 to 1 kΩ. The source-gate voltage $Vgs\_N1$ of 1 V not only exceeds the threshold voltage (e.g. 0.3 to 0.6 V) but also is large enough to generate a large trigger current $I_{trigger}$.

In addition, according to the present embodiment, a leakage current flowing from the signal line 5 to the ground line 6 at a time of normal operation is small. Due to voltage drop at a P-N junction between the anode and gate of the thyristor 7 (emitter-base junction of the PNP transistor Q1), the source of the PMOS transistor P1 is always maintained at a lower potential than the potential of the backgate and gate of the PMOS transistor P1 at the time of normal operation. It should be noted here that at the time of normal operation, the potential of the backgate and gate of the PMOS transistor P1 is maintained at the power supply voltage level VDD. Since the potential of the source of the PMOS transistor P1 is maintained lower than the potential of the backgate and gate thereof, the PMOS transistor P1 is maintained at the OFF state. Since the current I1 does not flow, the source-gate voltage of the NMOS transistor N1 becomes zero and thus the NMOS transistor N1 also is maintained at the OFF state. It is therefore possible according to the configuration of the present embodiment to reduce the leakage current that flows from the signal line 5 to the ground line 6 even at the time of normal operation.

As described above, according to the semiconductor device of the present embodiment, it is possible to generate the large trigger current $I_{trigger}$ and to supply it to the thyristor 7, even when the potential difference between the power supply line 4 and the signal line 5 is hardly generated due to the existence of the current path from the signal line 5 to the power supply line 4. Moreover, even in that case, the semiconductor device can perform a low-voltage operation. Furthermore, it is possible to reduce the leakage current that flows from the signal line 5 to the ground line 6 at the time of normal operation.

Second Embodiment

Figure 5:
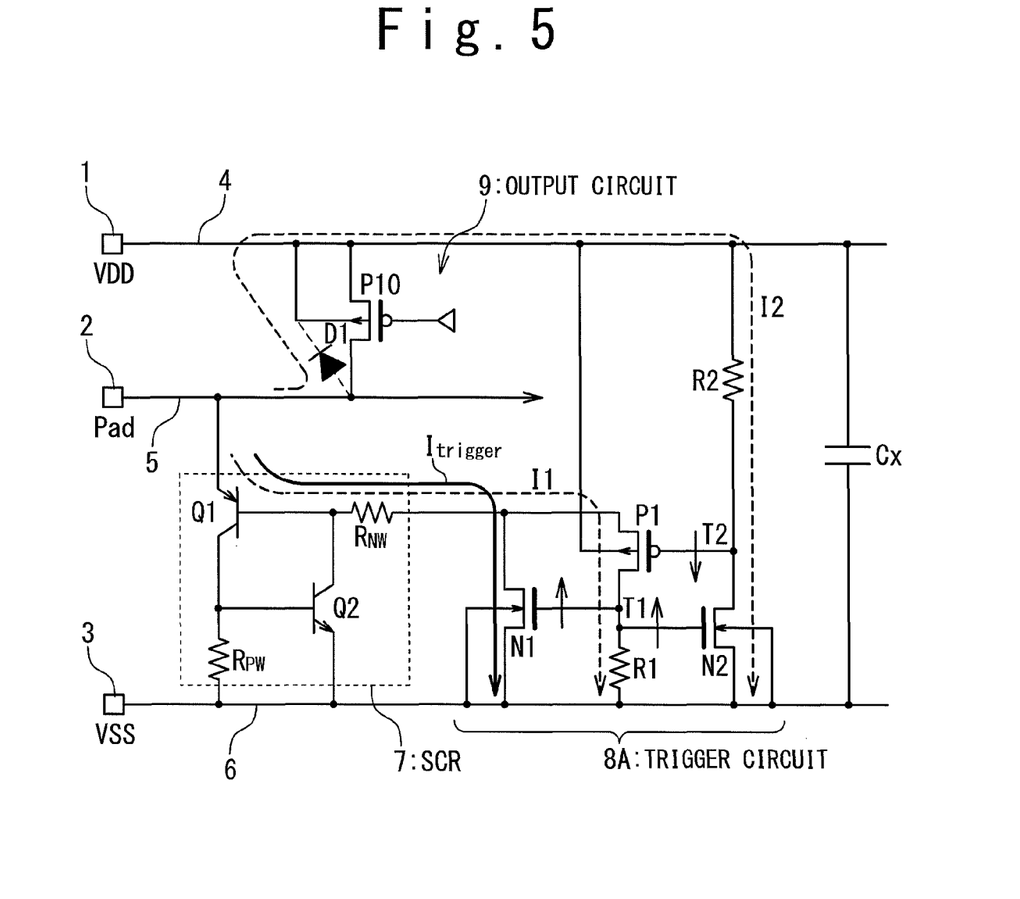
FIG. 5 is a circuit diagram showing a configuration of a semiconductor device according to a second embodiment of the present invention.

FIG. 5 is a circuit diagram showing a configuration of a semiconductor device according to a second embodiment of the present invention. In the present embodiment, a trigger circuit 8A whose configuration is different from the configuration in the first embodiment is used. More specifically, in the second embodiment, the trigger circuit 8A additionally includes an NMOS transistor N2 and a resistor element R2. A drain of the NMOS transistor N2 is connected to the node T2, a gate thereof is connected to the node T1, and a source thereof is connected to the ground line 6. The resistor element R2 is connected between the node T2 and the power supply line 4. The gate of the PMOS transistor P1 is connected to the node T2. The NMOS transistor N2 functions as a switch element that provides a current path from the node T2 to the ground line 6 in response to the potential of the node T1.

The trigger circuit 8A to which the NMOS transistor N2 and the resistor element R2 are added can supply much more trigger current $I_{trigger}$ as compared with the trigger circuit 8 in the first embodiment. An operation of the trigger circuit 8A of the second embodiment is described in detail hereinafter.

When the ESD surge is applied to the signal pad 2, the potential of the signal line 5 becomes higher than the potential of the power supply line 4 and the source potential of the PMOS transistor P1 becomes higher than the gate potential thereof. Accordingly, the PMOS transistor P1 starts to operate and the current I1 flows through the PMOS transistor P1. Since the current I1 generated in the PMOS transistor P1 flows through the resistor element R1, the potential of the node T1 is increased. When the potential of the node T1 is increased, the source-gate voltage of the NMOS transistor N1 is increased and thus the NMOS transistor N1 is turned ON. The operation described above is the same as in the case of the first embodiment.

In addition, when the potential of the node T1 is increases, the source-gate voltage of the NMOS transistor N2 also is increased. Therefore, the NMOS transistor N2 is turned ON, and a part of the discharging current of the ESD surge applied to the signal pad 2, namely a current I2 flows through the parasitic diode D1 of the PMOS transistor P10 and the NMOS transistor N2 to the ground line 6. It should be noted here that the NMOS transistor N2 also performs a normal MOS operation and does not perform a parasitic bipolar operation. When the current I2 flows, the source-gate voltage of the PMOS transistor P1 is increased due to the voltage drop at the resistor element R2. Here, the source-gate voltage Vgs_P1 of the PMOS transistor P1 is expressed by the following equation (4).

$$Vgs\_P1 = Vf\_D11 - Vbe + I2 \times R2 \qquad \text{Equation (4):}$$

Accordingly, when the current I2 flows, a condition expressed by the following equation (5) is more likely to be satisfied.

$$Vgs\_P1 = Vf\_D11 - Vbe + I2 \times R2 > Vt\_P1 \qquad \text{Equation (5):}$$

Here, "Vt_P1" is the threshold voltage of the PMOS transistor P1. In this manner, a difference between the source-gate voltage Vgs_P1 and the threshold voltage Vt_P1 of the PMOS transistor P1 becomes larger due to the current I2 flowing, which can increase the current I1 flowing through the PMOS transistor P1. Due to this effect, the source-gate voltage Vgs_N1 of the NMOS transistor N1 is further increased and thereby much more trigger current $I_{trigger}$ can be supplied. This enables a low-voltage and high-speed operation of the thyristor 7.

Depending on design, the resistance value of the resistor element R1 can be decreased instead of increasing the trigger current $I_{trigger}$. In the second embodiment, since the current I1 flowing through the PMOS transistor P1 is increased, an equivalent trigger current $I_{trigger}$ can be obtained even when the resistance value of the resistor element R1 is made smaller. To make the resistance value of the resistor element R1 smaller is preferable, because it is effective for reduction in a circuit area. Moreover, the resistance value of the resistor element R1 being small is preferable, because it can prevent the thyristor 7 from malfunction at the time of normal operation which is caused by increase in the potential of the node T1 due to high-speed pulses.

Figure 6:
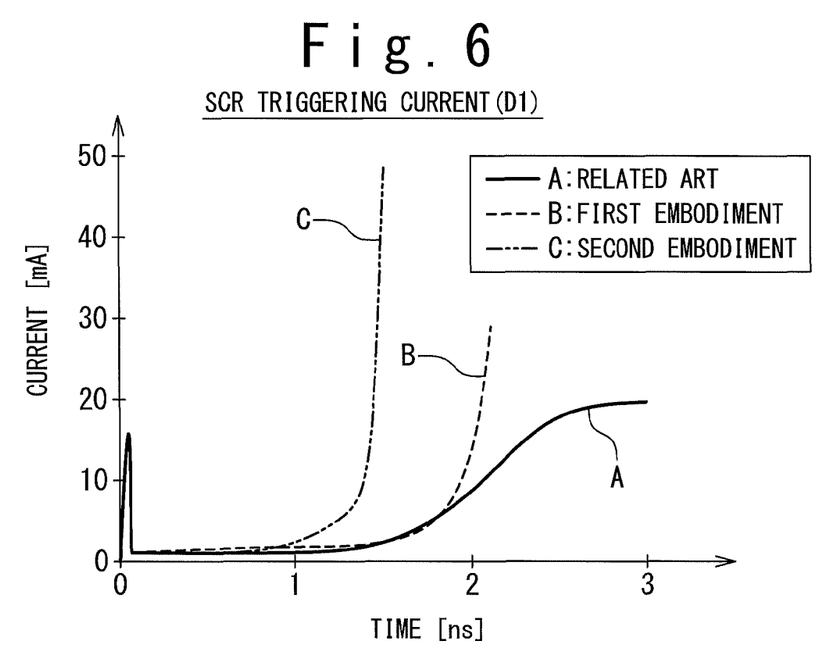
FIG. 6 is a graph showing waveforms of trigger currents in the electrostatic discharge protection circuit shown in FIG. 1 and in the electrostatic discharge protection circuits of the first and second embodiments.

Simulation results of the operation of the semiconductor devices according to the first and second embodiments will be described below. FIG. 6 is a graph showing simulation results of the magnitude of the trigger currents generated in the electrostatic discharge protection circuit shown in FIG. 1 and in the electrostatic discharge protection circuits of the first and second embodiments shown in FIGS. 4 and 5. Here, a symbol "A" represents a waveform of the trigger current in the electrostatic discharge protection circuit shown in FIG. 1, and symbols "B" and "C" respectively represent waveforms of the trigger currents in the electrostatic discharge protection circuits of the first and the second embodiments. As can be seen from FIG. 6, the amount of the trigger current in the cases of the electrostatic discharge protection circuits of the first and second embodiments is significantly increased as comparison with the case of the electrostatic discharge protection circuit shown in FIG. 1. In the case of the electrostatic discharge protection circuit of the second embodiment wherein the bias for the PMOS transistor P1 is enhanced, the trigger current can be further increased as compared with the case of the electrostatic discharge protection circuit of the first embodiment.

Figure 7:
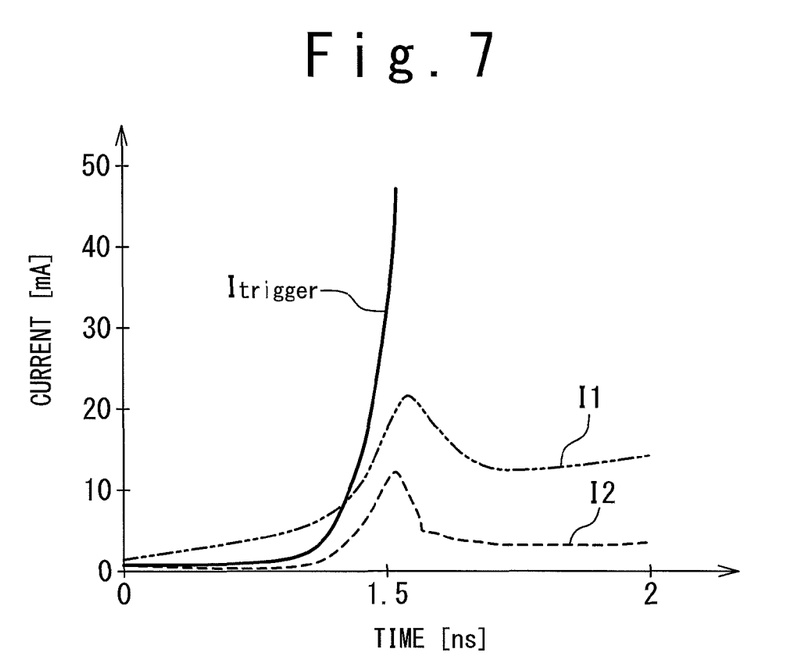
FIG. 7 is a graph showing waveforms of respective currents flowing in the electrostatic discharge protection circuit of the second embodiment.

FIG. 7 is a graph showing an operation example of the electrostatic discharge protection circuit of the second embodiment. Specifically, FIG. 7 shows waveforms of: (1) the current I1 flowing through the PMOS transistor P1, (2) the current I2 flowing through the NMOS transistor N2 and (3) the trigger current $I_{trigger}$ (current flowing through the NMOS transistor N1).

As shown in FIG. 7, the current I1 first flows through the PMOS transistor P1. Subsequently, when the current I1 flows through the resistor element R1 and the gate-source voltage of the NMOS transistor N1 becomes the threshold voltage or more, the NMOS transistor N1 starts the MOS operation (not a parasitic bipolar operation) and thereby the large trigger current $I_{trigger}$ flows. Simultaneously, the gate-source voltage of the NMOS transistor N2 is increased and the current I2 flows. As a result, the gate-source voltage of the PMOS transistor P1 is increased and the current I1 is increased. Consequently, the trigger current $I_{trigger}$ is increased. In the operation shown in FIG. 7, the current I1 reaches 20 mA and the trigger current $I_{trigger}$ exceeds 50 mA.

Figure 2A:
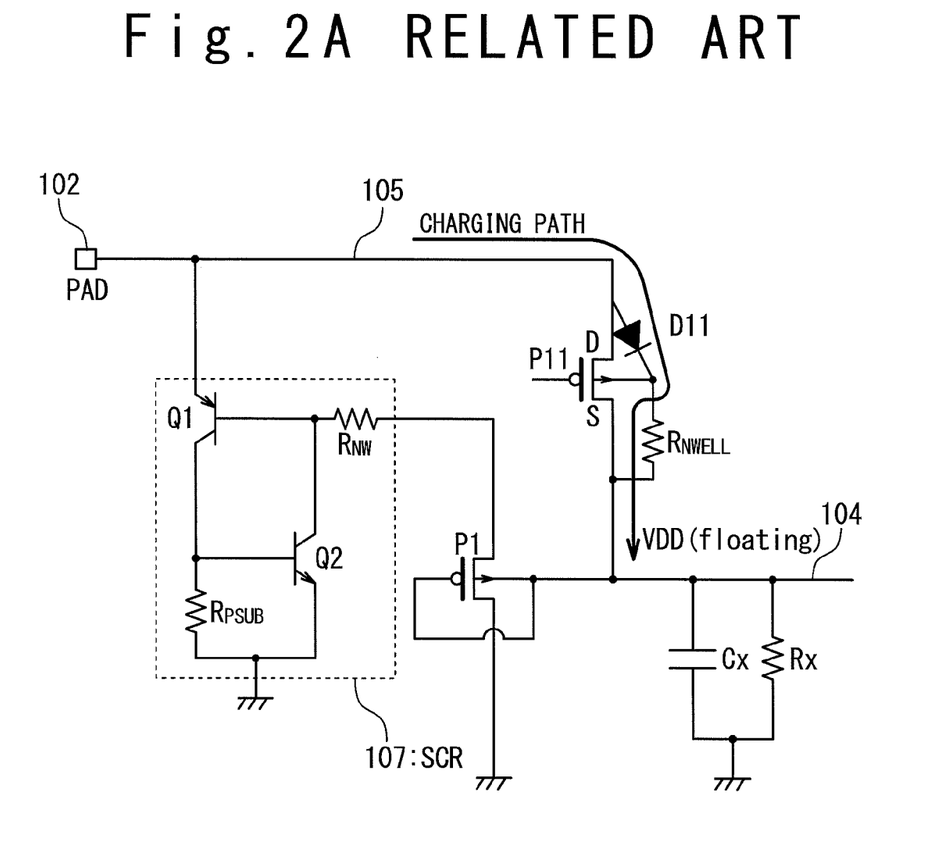
FIG. 2A is a circuit diagram for explaining a problem in the electrostatic discharge protection circuit shown in FIG. 1.
Figure 2B:
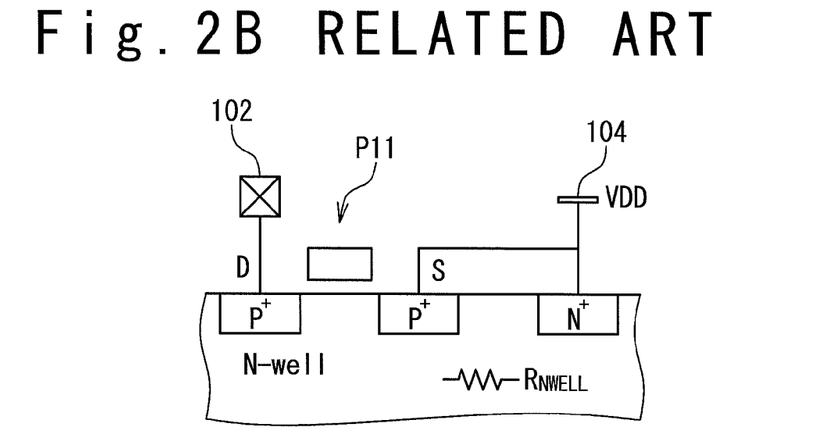
FIG. 2B is a cross-sectional view illustrating a structure of a PMOS transistor in the electrostatic discharge protection circuit shown in FIG. 1.

While the various embodiments of the present invention have been described above, the present invention is not limited to the foregoing embodiments. For example, in the above-described embodiments, the PMOS transistor P10 which is used as a pull-up transistor is connected to the signal line 5. The present invention can be preferably applied to a configuration in which a part of the discharging current flows from the signal line 5 to the power supply line 4 when the ESD surge is applied. In particular, the present invention can be preferably applied to a configuration in which a parasitic diode or a diode element is connected between the signal line 5 and the power supply line 4. For example, the present invention can be preferably applied to a configuration in which an ESD protection diode is connected between the signal line 5 and the power supply line 4 as shown in FIG. 2A.

Figure 8:
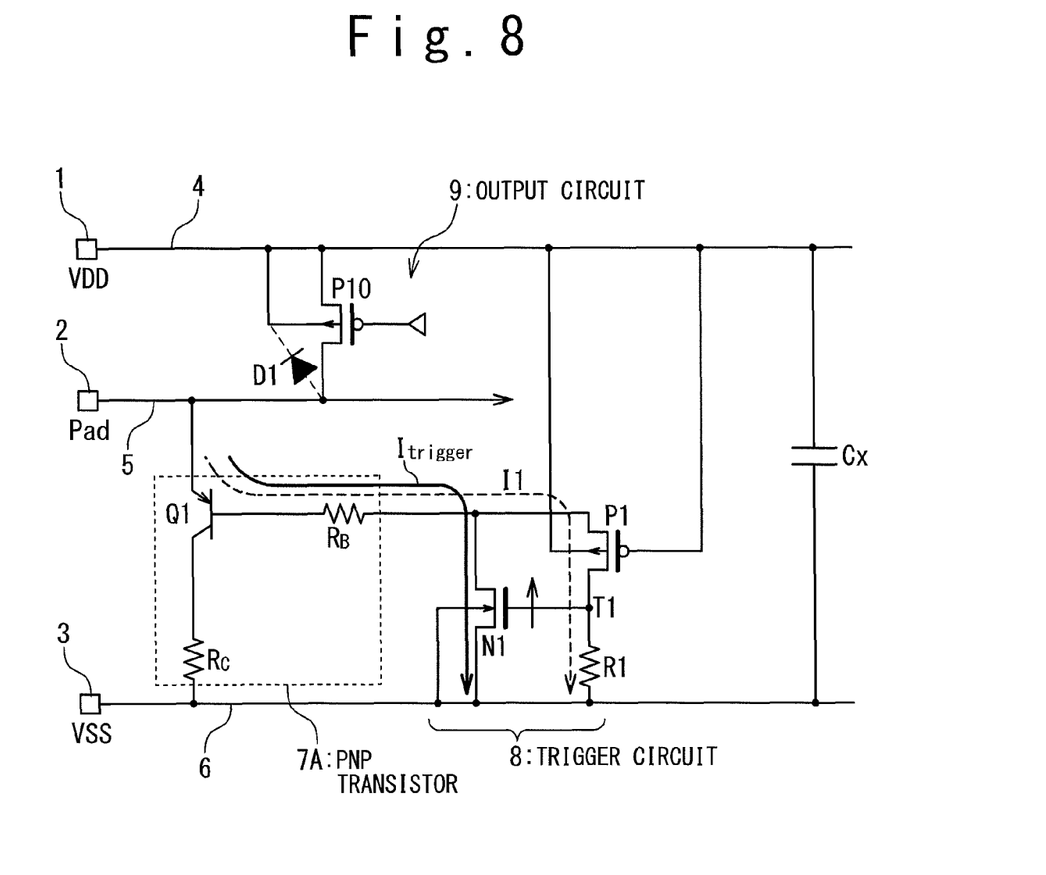
FIG. 8 is a circuit diagram showing a modification example of the configuration of the semiconductor device according to the first embodiment.
Figure 9:
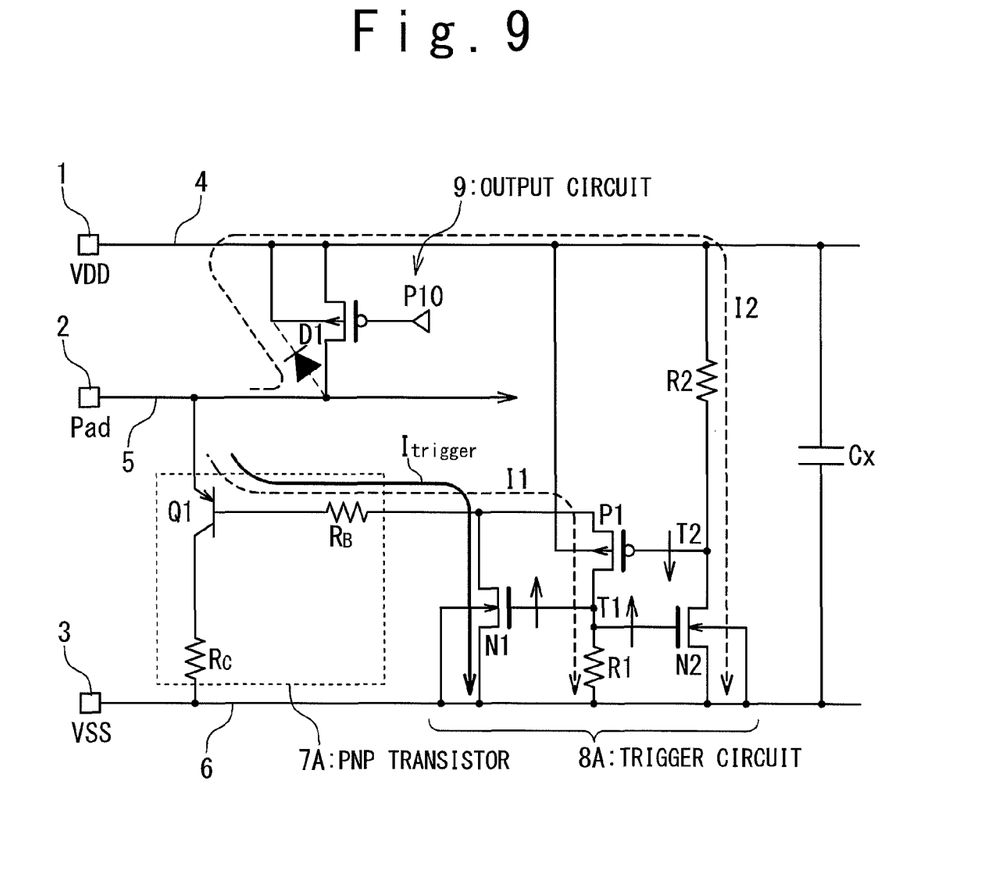
FIG. 9 is a circuit diagram showing a modification example of the configuration of the semiconductor device according to the second embodiment.

In the foregoing embodiments, the thyristor 7 is used as the protection element in the electrostatic discharge protection circuit. However, another protection element such as a PNP transistor can also be used instead of the thyristor 7. FIG. 8 shows a configuration in which the thyristor 7 in the electrostatic discharge protection circuit of the first embodiment is replaced with a PNP transitory 7A. FIG. 9 shows a configuration in which the thyristor 7 in the electrostatic discharge protection circuit of the second embodiment is replaced with a PNP transitory 7A. In FIGS. 8 and 9, a base resistance component and a corrector resistance component of the PNP transistor 7A are denoted by symbols "$R_B$" and "$R_C$", respectively, and an element which functions simply as a bipolar transistor is equivalently represented by a symbol "Q1". As shown in FIGS. 8 and 9, an emitter of the PNP transistor 7A is connected to the signal line 5, a collector thereof is connected to the ground line 6, and a base thereof is connected to the trigger circuit 8 or the trigger circuit 8A.

It is apparent that the present invention is not limited to the above embodiments and may be modified and changed without departing from the scope and spirit of the invention.

What is claimed is:

1. A semiconductor device comprising:
a power supply line;
a ground line;
a signal line;
a signal pad coupled to said signal line;
a thyristor coupled between said signal line and said ground line; and
a trigger circuit configured to be coupled to said thyristor, wherein said trigger circuit comprises:
   a PMOS transistor whose gate and backgate are coupled to said power supply line and whose source is coupled to a gate of said thyristor;
   a first resistor element coupled between a drain of said PMOS transistor and said ground line; and
   a first NMOS transistor whose drain is coupled to said gate of said thyristor, whose source is coupled to said ground line, whose gate is coupled to said drain of said PMOS transistor, and whose backgate is directly coupled to said ground line.

2. The semiconductor device according to claim 1, further comprising:
a second resistor element coupled between said gate of said PMOS transistor and said power supply line; and
a second NMOS transistor whose drain is coupled to said gate of said PMOS transistor, whose gate is coupled to said drain of said PMOS transistor, and whose source is coupled to said ground line.

3. The semiconductor device according to claim 1,
further comprising a diode coupled between said signal line and said power supply line.

* * * * *